United States Patent
Kubo et al.

(10) Patent No.: US 6,861,915 B2
(45) Date of Patent: Mar. 1, 2005

(54) CRYSTAL OSCILLATOR WITH ADJUSTABLE CAPACITIVE ASSEMBLY HAVING SELECTABLE CAPACITANCES

(75) Inventors: Kuichi Kubo, Saitama (JP); Fumio Asamura, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/201,467

(22) Filed: Jul. 23, 2002

(65) Prior Publication Data

US 2003/0025567 A1 Feb. 6, 2003

(30) Foreign Application Priority Data

Jul. 24, 2001 (JP) ........................................ 2001-223595

(51) Int. Cl.[7] ................................................ H03B 5/32
(52) U.S. Cl. .................................. 331/158; 331/177 R
(58) Field of Search ...................... 331/44, 176, 116 FE, 331/109, 158, 116 R, 177 R, 177 V, 179

(56) References Cited

U.S. PATENT DOCUMENTS

| | | | | |
|---|---|---|---|---|
| 5,030,926 A | * | 7/1991 | Walden ................. | 331/116 FE |
| 5,150,081 A | * | 9/1992 | Goldberg ................. | 331/109 |
| 5,428,319 A | * | 6/1995 | Marvin et al. ............. | 331/176 |
| 5,511,126 A | * | 4/1996 | Westwick ................. | 331/44 |
| 5,844,448 A | * | 12/1998 | Jackoski et al. ............ | 331/158 |
| 2001/0052826 A1 | | 12/2001 | Kubo et al. | |

* cited by examiner

Primary Examiner—Minh Nguyen
(74) Attorney, Agent, or Firm—Katten Muchin Zavis Rosenman

(57) ABSTRACT

A crystal oscillator has a quartz-crystal unit, a first oscillating capacitor connected between a first end of the crystal unit and a reference potential point, a second oscillating capacitor connected between a second end of the crystal unit and the reference potential point, a CMOS inverter connected parallel to the crystal unit, and a feedback resistor connected across the inverter. The crystal oscillator can easily be incorporated into integrated circuits and has an increased variable oscillation frequency range. The crystal oscillator also has an adjustable capacitive assembly having selectable capacitances which is connected parallel to a combined capacitor comprising the first and the second oscillating capacitors.

7 Claims, 7 Drawing Sheets

CRYSTAL OSCILLATOR WITH ADJUSTABLE CAPACITIVE ASSEMBLY HAVING SELECTABLE CAPACITANCES

BACKGROUND OF THE INVENTION

1. Field of the Invention

The present invention relates to a small-size quartz-crystal oscillator designed for easy incorporation into integrated circuits in electronic devices, and more particularly to a crystal oscillator for surface mount applications which has an oscillation frequency variable in an increased range.

2. Description of the Related Art

Surface-mount crystal oscillators have a casing suitable for use in surface mount applications, and a quartz-crystal unit and an integrated circuit (IC) chip are sealed in the casing, the IC chip comprising an oscillating circuit using the crystal unit. Since such surface-mount crystal oscillators are small in size and weight, they are widely used as a frequency and time reference source in portable electronic devices such as cellular phone apparatuses. In recent years, surface-mount crystal oscillators are required to have a smaller size, e.g., a planar profile of 4 mm×2.5 mm or less. To meet such a requirement, the crystal blanks used in the surface-mount crystal oscillators are reduced in size and hence the variable range of oscillation frequencies thereof is also reduced. There are demands for improving the reduced variable range of oscillation frequencies.

FIG. 1 shows a cross-sectional structure of a conventional surface-mount crystal oscillator. As shown in FIG. 1, the conventional surface-mount crystal oscillator has casing 1 substantially in the form of a rectangular parallelepiped which has a recess defined in a principal surface thereof and having a step. The conventional surface-mount crystal oscillator is fabricated by fixing IC chip 2 to the bottom of the recess in casing 1 according to face-down bonding, fixing opposite sides of one end of crystal blank 3, which constitutes a crystal unit, to the step with conductive adhesive 4, and thereafter placing cover 5 on casing 1 to seal the recess. Crystal blank 3 and IC chip 2 are electrically connected to each other by a conductive path formed on an inner surface of the recess in casing 1. Connecting electrodes for external connection are formed on an outer surface of casing 1, and are electrically connected to IC chip 2 by a conductive path which extends through casing 1.

IC chip 2 comprises an integrated circuit except quartz-crystal unit 3A (crystal blank 3) of the crystal oscillating circuit, and may include a temperature compensating circuit, for example, in addition to basic oscillating circuit components. As shown in FIG. 2, the oscillating circuit comprises capacitors 6a, 6b connected to respective opposite ends of crystal unit 3A and ground to a reference potential, or a ground potential in FIG. 2, thus providing a resonance circuit. A C-MOS (Complementary Metal Oxide Semiconductor) inverting amplifier (inverter) 7 is connected parallel to crystal unit 3A for amplifying a resonance frequency component of the resonance circuit through a feedback loop. Feedback resistor 8 is connected across inverter 7. An oscillation output Vo is produced from an output terminal of inverter 7.

The oscillation frequency of the crystal oscillator generally depends on the resonance frequency of the resonance circuit, and is strictly determined by an equivalent series capacitance (so-called load capacitance) including inverter 7 as viewed from crystal unit 3A. The oscillation frequency is specifically a series resonance frequency determined by an inductive component provided by crystal unit 3A and a circuit capacitive component mainly provided by oscillating capacitors 6a, 6b.

With the above surface-mount crystal oscillator, if the size of crystal blank 3 (crystal unit 3A) is smaller in size, then the variable range of oscillating frequencies is reduced. Therefore, when oscillators of various different oscillating frequencies are to be fabricated, since the range of oscillating frequencies that can be generated by one crystal unit 3A (crystal blank 3) is narrow, it is necessary to provide a large number of different crystal blanks 3, resulting in a reduction in productivity.

Specifically, a variable range of oscillating frequency f is represented by a frequency deviation $\Delta f/fs$ which is the difference $\Delta f$ ($=f-fs$) between the oscillating frequency f and a series resonance frequency fs of the crystal unit, as divided by the series resonance frequency fs, and expressed by the following equation (1):

$$\Delta f/fs = C_1/2(C_0+CL) \qquad (1)$$

where C0 represent a parallel equivalent capacitance (i.e., inter-electrode capacitance) of crystal blank 3, C1 a series equivalent capacitance, and CL a load capacitance.

Consequently, if the size (plate area) of crystal blank 3 is reduced, the parallel equivalent capacitance C0 remains substantially unchanged as it needs a certain electrode area, and the series equivalent capacitance C1 is decreased. Therefore, the frequency deviation $\Delta f/fs$ is also reduced, and the variable oscillation frequency range is narrowed. Thus, many different crystal blanks 3 need to be available in order to produce crystal oscillators having oscillating frequencies which meet demands in the market.

SUMMARY OF THE INVENTION

It is therefore an object of the present invention to provide a crystal oscillator which can easily be incorporated into integrated circuits and has an increased variable frequency range.

According to the present invention, the above object can be achieved by a crystal oscillator comprising a crystal unit, a first oscillating capacitor connected between a first end of the crystal unit and a reference potential point, a second oscillating capacitor connected between a second end of the crystal unit and the reference potential point, and an adjustable capacitive assembly having selectable capacitances which is connected parallel to a combined capacitor comprising the first and second oscillating capacitors.

With the above arrangement, when the adjustable capacitive assembly is operated on to set one of the selectable capacitances, the equivalent series capacitance as viewed from the crystal unit is changed. As a result, the variable range of oscillating frequencies of the crystal oscillator can be increased. Since the adjustable capacitive assembly is connected parallel to the combined capacitor which comprises the first oscillating capacitor and the second oscillating capacitor, the equivalent series capacitance can be changed more largely than if the adjustable capacitive assembly is connected in series to the combined capacitor. The variable range of oscillating frequencies of the crystal oscillator can be increased by the increased change of the equivalent series capacitance, allowing the crystal oscillator to be easily incorporated into an integrated circuit.

DETAILED DESCRIPTION OF THE PREFERRED EMBODIMENTS

Figure 1:
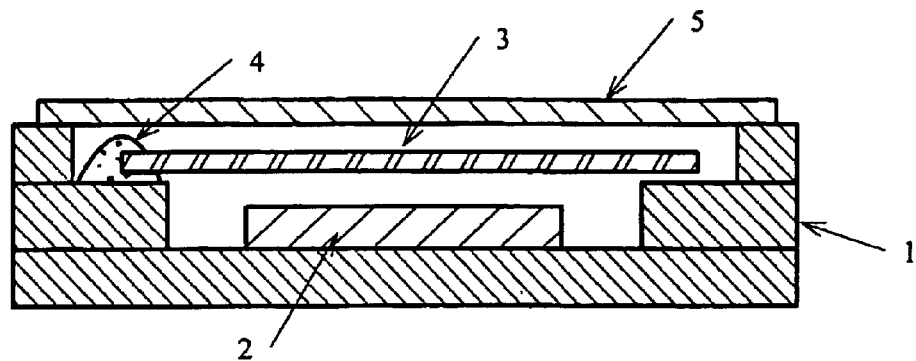
FIG. 1 is a cross-sectional view of a conventional surface-mount crystal oscillator.

A surface-mount crystal oscillator according to a first embodiment of the present invention is fabricated, as with the conventional crystal oscillator shown in FIG. 1, by fixing an IC chip comprising oscillating capacitors 6a, 6b, inverting amplifier 7, etc. on the bottom of a recess defined in a casing, fixing a quartz-crystal blank to a step in the recess, and placing a cover on the casing to seal the recess.

Figure 2:
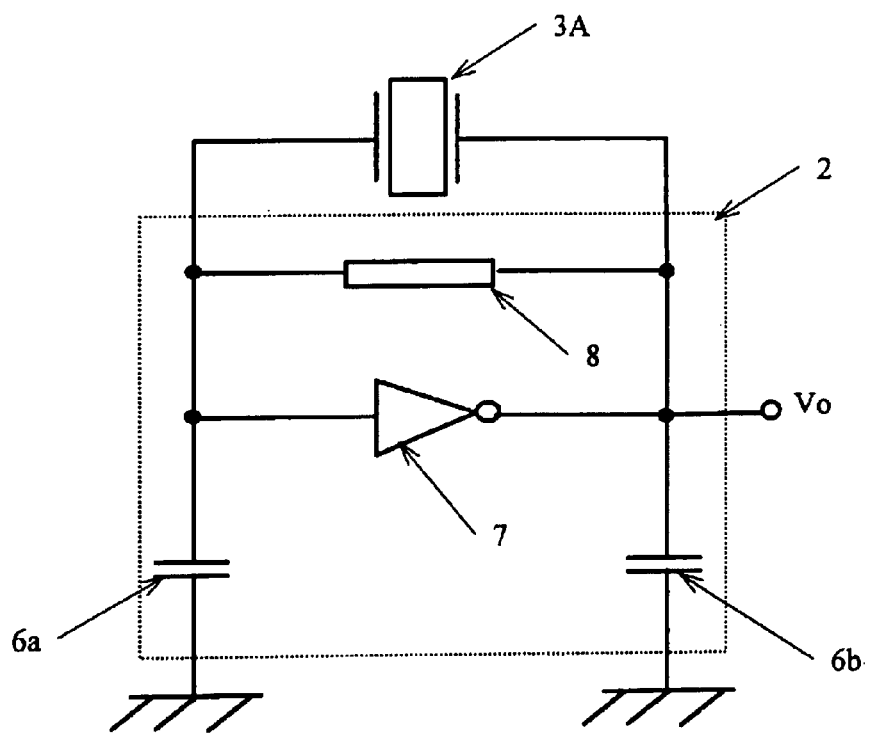
FIG. 2 is a circuit diagram of the conventional surface-mount crystal oscillator.
Figure 3:
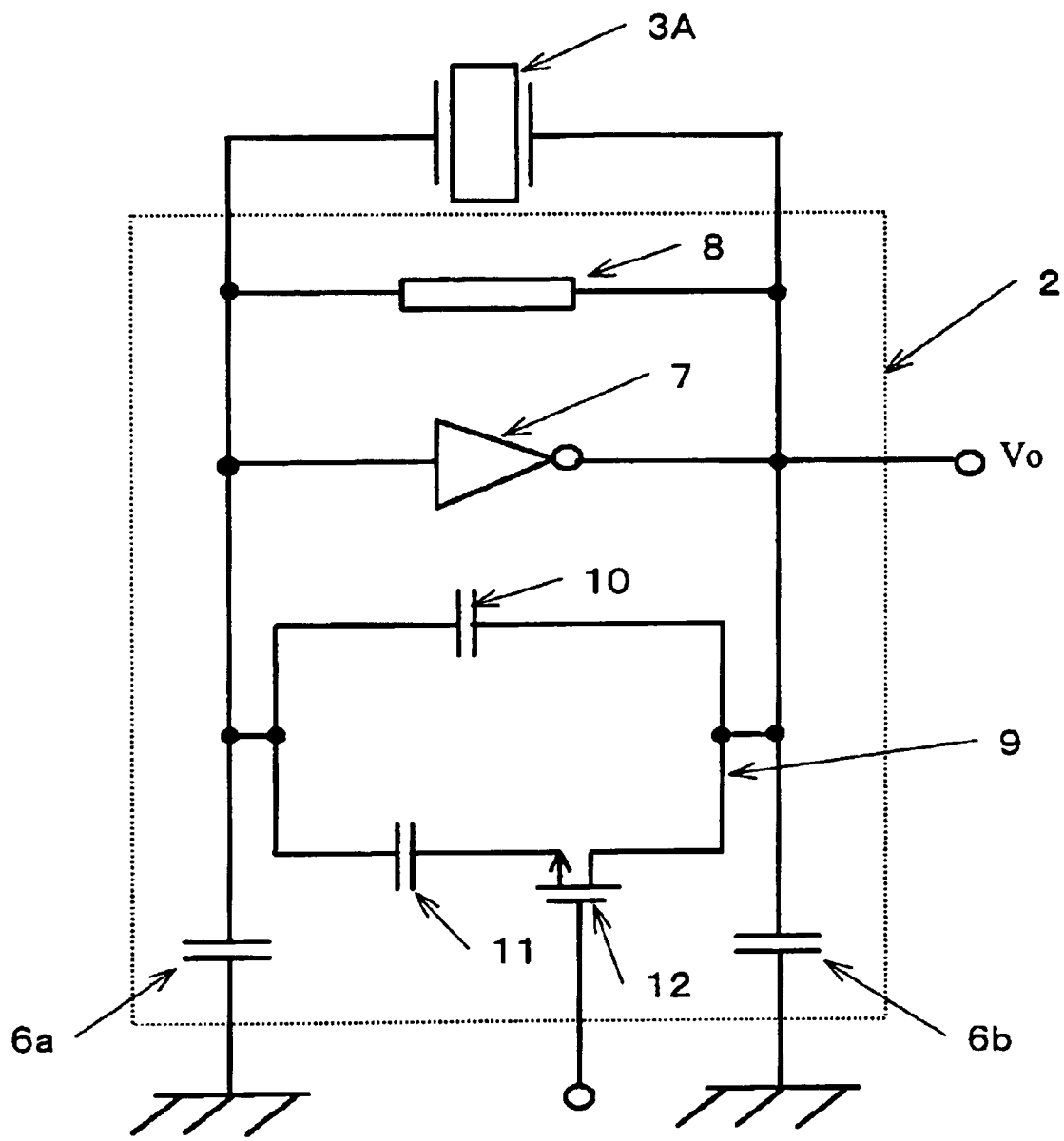
FIG. 3 is a circuit diagram of a surface-mount crystal oscillator according to a first embodiment of the present invention.

FIG. 3 shows a circuit arrangement of the surface-mount crystal oscillator according to the first embodiment. Those parts shown in FIG. 3 which are identical to those shown in FIGS. 1 and 2 are denoted by identical reference characters.

The circuit arrangement shown in FIG. 3 differs from the circuit arrangement shown in FIG. 2 in that adjustable capacitive assembly 9 capable of selecting an effective capacitance is connected parallel to crystal unit 3A. Adjustable capacitive assembly 9 comprises first capacitor 10 and a series-connected circuit of second capacitor 11 and switching element 12, the series-connected circuit being connected parallel to first capacitor 10. Switching element 12 may comprise a MOSFET (Metal-oxide-semiconductor field effect transistor), for example. If switching element 12 comprises a MOSFET, then when an ON signal is applied to its gate, it becomes conductive between its source and drain, and when an OFF signal is applied to its gate, it becomes nonconductive between its source and drain. Therefore, the effective capacitance of adjustable capacitive assembly 9 is selectively set to one of two values depending on whether an ON signal or an OFF signal is applied to the gate of switching element 12. Capacitors 10, 11, switching element 12, oscillating capacitors 6a, 6b, inverting amplifier 7, and feedback resistor 8 are integrated in one IC chip 2.

Figure 4:
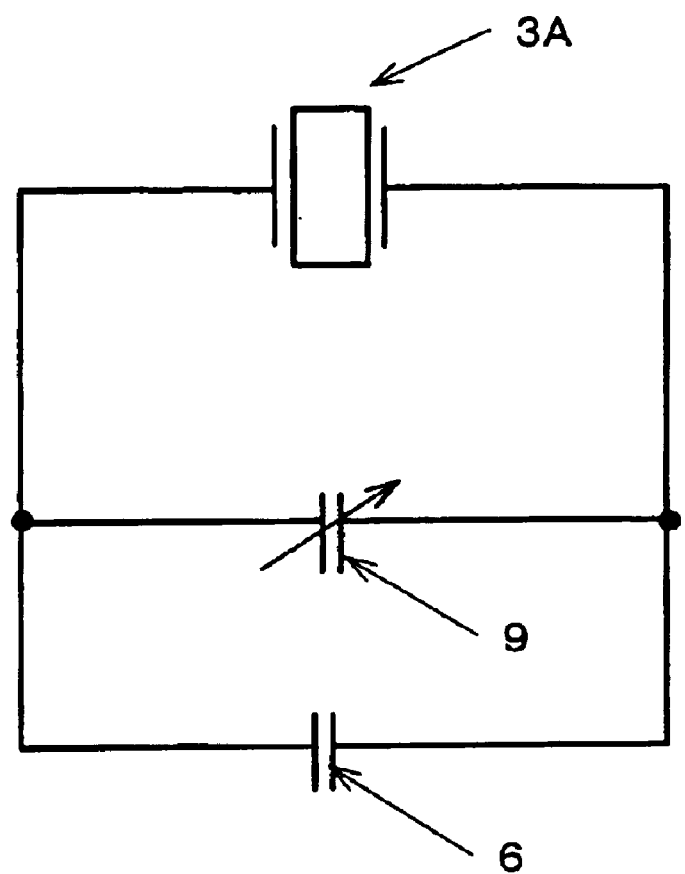
FIG. 4 is an equivalent circuit diagram showing capacitive components of the surface-mount crystal oscillator shown in FIG. 3.

A capacitive component (i.e., equivalent series capacitance) as viewed from crystal unit 3A is generally represented by a parallel-connected circuit of combined capacitor 6 composed of oscillating capacitors 6a, 6b and adjustable capacitive assembly 9, as shown in FIG. 4. The equivalent series capacitance as viewed from crystal unit 3A is represented by C6+C9 where C6 represents the capacitance of combined capacitor 6 and C9 the capacitance of adjustable capacitive assembly 9. Actually, the capacitive components of inverting amplifier 7 and feedback resistor 8 are also added, but are omitted for illustrative purposes because those capacitive components are small.

When switching element 12 of adjustable capacitive assembly 9 is turned off, only first capacitor 10 becomes effective. Therefore, adjustable capacitive assembly 9 has only the capacitance C10 of first capacitor 10, and the equivalent series capacitance is represented by C6+C10.

When switching element 12 of adjustable capacitive assembly 9 is turned on, second capacitor 11 also becomes effective. Therefore, adjustable capacitive assembly 9 has the sum of the capacitances C10, C11 of first and second capacitors 10, 11, and the equivalent series capacitance is represented by C6+(C10+C11).

Since the equivalent series capacitance can be changed by selectively turning on and off switching element 12 of adjustable capacitive assembly 9, the variable range of oscillating frequencies of the surface-mount crystal oscillator is increased. When switching element 12 is turned on, the oscillating frequency is shifted into a lower range because the equivalent series capacitance is increased.

In the present embodiment, adjustable capacitive assembly 9 is connected parallel to combined capacitor 6 composed of oscillating capacitors 6a, 6b. Therefore, a change in the capacitance of adjustable capacitive assembly 9 directly becomes a change in the equivalent series capacitance. Thus, a change in the equivalent series capacitance is greater than if adjustable capacitive assembly 9 is connected in series to combined capacitor 6.

Examples in which the selectable adjustable capacitive assembly is connected parallel to the combined capacitor and in series to the combined capacitor will be compared with each other.

It is assumed that each of oscillating capacitors 6a, 6b has a capacitance of 10 pF, i.e., the capacitance C6 of combined capacitor 6 is 5 pF, and the crystal oscillator is oscillated. If a capacitor having a capacitance of 10 pF is connected in series to the oscillating capacitors, then the combined series capacitance becomes 3.3 pF, i.e., is decreased by 1.7 pF.

In the present embodiment, it is assumed that each of oscillating capacitors 6a, 6b has a capacitance of 5 pF, i.e., the capacitance C6 is 2.5 pF, to equalize the condition upon the comparison. First capacitor 10 of adjustable capacitive assembly 9 is set to a capacitance of 2.5 pF, and switching element 12 is turned off. When the crystal oscillator is oscillated, the same oscillating frequency as described above is produced. If it is assumed that second capacitor 11 has a capacitance of 10 pF, and switching element 12 is turned on, connecting second capacitor 11 parallel to first capacitor 10, then the combined parallel capacitance becomes 15 pF, i.e., is increased by 10 pF.

The comparison between the above examples shows that when the adjustable capacitive assembly is connected in series to the oscillating capacitors, a total capacitance of 30 pF is required, resulting in a change of 1.7 pF in the equivalent series capacitance, and when the adjustable capacitive assembly is connected parallel to the oscillating capacitors as with the present embodiment, a total capacitance of 22.5 pF is required, resulting in a change of 10 pF in the equivalent series capacitance. Therefore, the crystal oscillator according to the present embodiment requires an overall capacitance which is ¾ of the overall capacitance of the crystal oscillator where the adjustable capacitive assembly is connected in series to the oscillating capacitors, and can achieve a change in the equivalent series capacitance which is 5.9 times the change in the equivalent series capacitance of the crystal oscillator where the adjustable capacitive assembly is connected in series to the oscillating capacitors. Since the capacitors that are needed are integrated in IC chip 2, the floor size taken up by the capacitive elements in the IC chip is reduced, allowing the capacitive elements to be easily incorporated into an integrated circuit and making the IC chip small in size.

Figure 5:
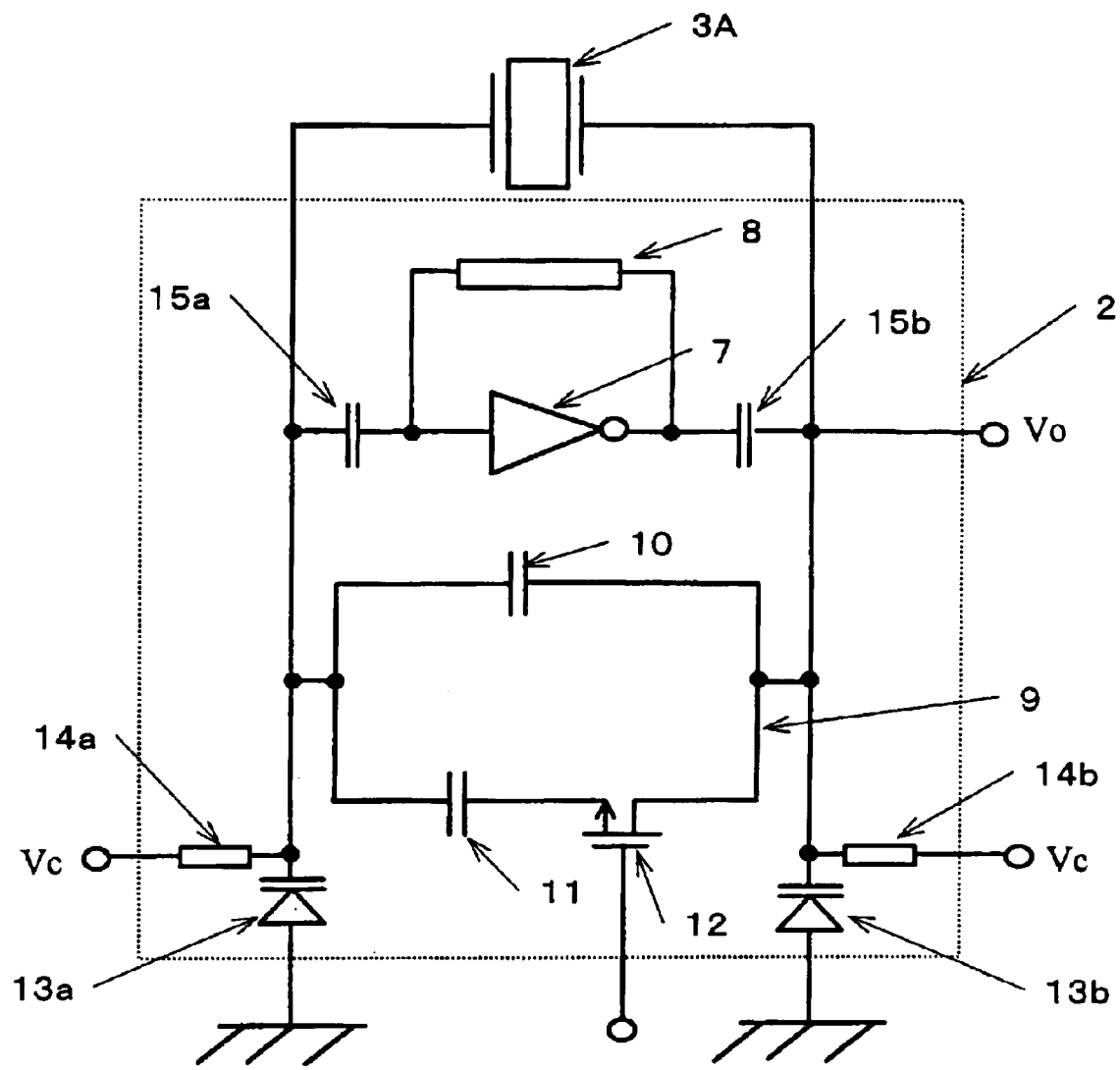
FIG. 5 is a circuit diagram of a voltage-controlled surface-mount crystal oscillator according to a second embodiment of the present invention.

The principles of the present invention are also applicable to a voltage-controlled crystal oscillator. FIG. 5 shows a voltage-controlled surface-mount crystal oscillator according to a second embodiment of the present invention. The voltage-controlled surface-mount crystal oscillator has its oscillating frequency variable depending on a control voltage input thereto.

The voltage-controlled surface-mount crystal oscillator according to the second embodiment shown in FIG. 5 differs from the surface-mount crystal oscillator according to the first embodiment shown in FIG. 3 in that it has voltage-variable capacitive elements 13a, 13b instead of oscillating capacitors 6a, 6b, respectively, resistors 14a, 14b for applying a control voltage Vc to voltage-variable capacitive elements 13a, 13b, and DC-blocking capacitors 15a, 15b for preventing the control voltage Vc from being applied to the input and output terminals of inverting amplifier 7. Voltage-variable capacitive elements 13a, 13b typically comprises variable-capacitance diodes having anodes connected to a ground potential and cathodes connected to respective ends of crystal unit 3A. The control voltage Vc is applied to the cathodes of voltage-variable capacitive elements 13a, 13b via respective resistors 14a, 14b which serve to cut off high frequency components. DC-blocking capacitor 15a is inserted between the input terminal of inverting amplifier 7 and one end of crystal unit 3A, and DC-blocking capacitor 15b is inserted between the output terminal of inverting amplifier 7 and the other end of crystal unit 3A. An output voltage Vo is extracted from the other end of crystal unit 3A.

The control voltage Vc comprises, for example, a temperature compensating voltage for compensating for temperature-depending characteristics of the crystal unit to make flat the temperature vs. frequency characteristics of the crystal oscillator.

Figure 6:
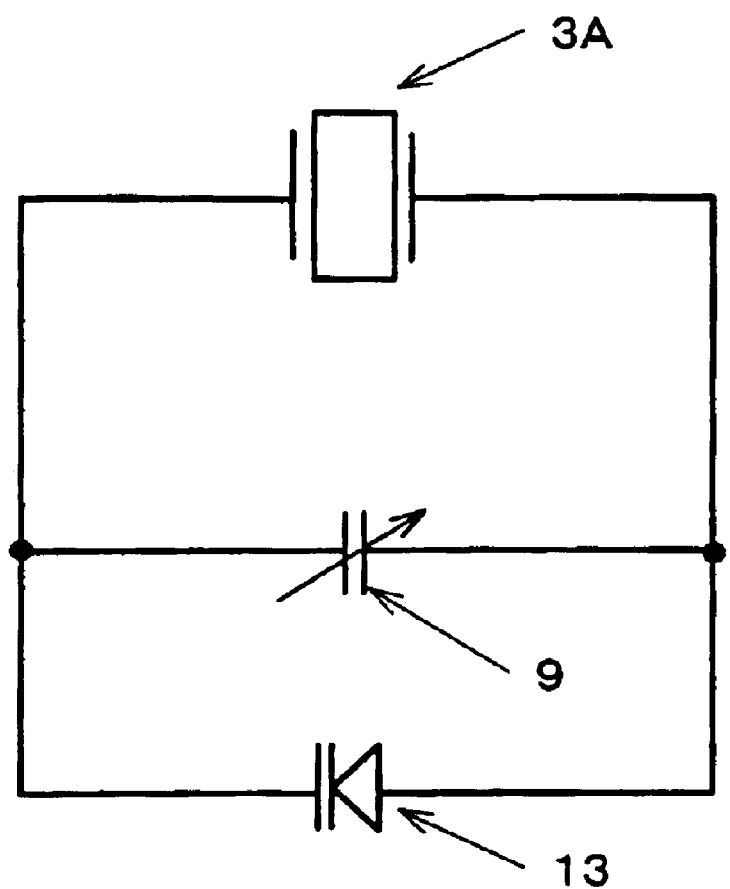
FIG. 6 is an equivalent circuit diagram showing capacitive components of the voltage-controlled surface-mount crystal oscillator shown in FIG. 5.

With the crystal oscillator shown in FIG. 5, the capacitive component as viewed from crystal unit 3A is represented by a parallel-connected circuit of adjustable capacitive assembly 9 and combined voltage-variable capacitor 13 composed of voltage-variable capacitive element 13a, 13b, as shown in FIG. 6. As with the first embodiment, the equivalent series capacitance as viewed from crystal unit 3A can be changed by selectively turning on and off switching element 12 to make selectively effective and ineffective second capacitor 11 of adjustable capacitive assembly 9. The variable range of oscillating frequencies of the crystal oscillator is thus increased, and after an oscillating frequency is selected, the selected oscillating frequency can be controlled by the control voltage. The range in which the oscillating frequency is varied by adjustable capacitive assembly 9 is greater than the range in which the oscillating frequency is controlled by the control voltage.

As adjustable capacitive assembly 9 is connected combined voltage-variable capacitor 13 and combined DC-blocking capacitor 15, the equivalent series capacitance can be changed largely, and the oscillating circuit can easily be integrated. Furthermore, DC-blocking capacitors 15a, 15b are connected parallel to crystal unit 3A outside of the resonance loop which is made up of crystal unit 3A and oscillating voltage-variable capacitive elements 13a, 13b. Since direct currents may simply be blocked to prevent the control voltage Vc from being applied to inverting amplifier 7, the capacitance of DC-blocking capacitors 15a, 15b may be smaller than if are they inserted in series in the resonance loop. This feature also allows the oscillating circuit to be easily integrated.

If DC-blocking capacitors 15a, 15b are disposed in the resonance loop, then the capacitance thereof needs to be increased not only for blocking direct currents, but also for passing high frequency components. In this case, it is necessary to include capacitors of relatively large capacitances in IC chip 2 and hence increase the size of IC chip 2.

A surface-mount crystal oscillator according to a third embodiment of the present invention will be described below. In the second embodiment shown in FIG. 5, the oscillating capacitors in the crystal oscillator according to the first embodiment are replaced with voltage-variable capacitive elements 13a, 13b, providing a voltage-controlled resonance circuit. According to the second embodiment, since voltage-variable capacitive elements 13a, 13b and adjustable capacitive assembly 9 are connected parallel to each other, a change of the capacitance of voltage-variable capacitance elements 13a, 13b with respect to the control voltage is essentially reduced by adjustable capacitive assembly 9. For example, if it is assumed that the capacitance of combined voltage-variable capacitor 13 when no voltage is applied thereto is represented by an X and an increase in the capacitance of combined voltage-variable capacitor 13 when the control voltage is applied thereto is represented by ΔX, then the rate of change of the capacitance of combined voltage-variable capacitor 13 itself is represented by ΔX/X, and the rate of change of the capacitance of combined voltage-variable capacitor 13 with adjustable capacitive assembly 9 connected parallel thereto is represented by ΔX/(X+C9). Thus, because the rate of change of the capacitance with respect to the control voltage Vc is reduced, the range of change of the frequency is also reduced, resulting in a reduction in efficiency. According to the third embodiment, the oscillating frequency is changed largely as the control voltage is changed.

Figure 7:
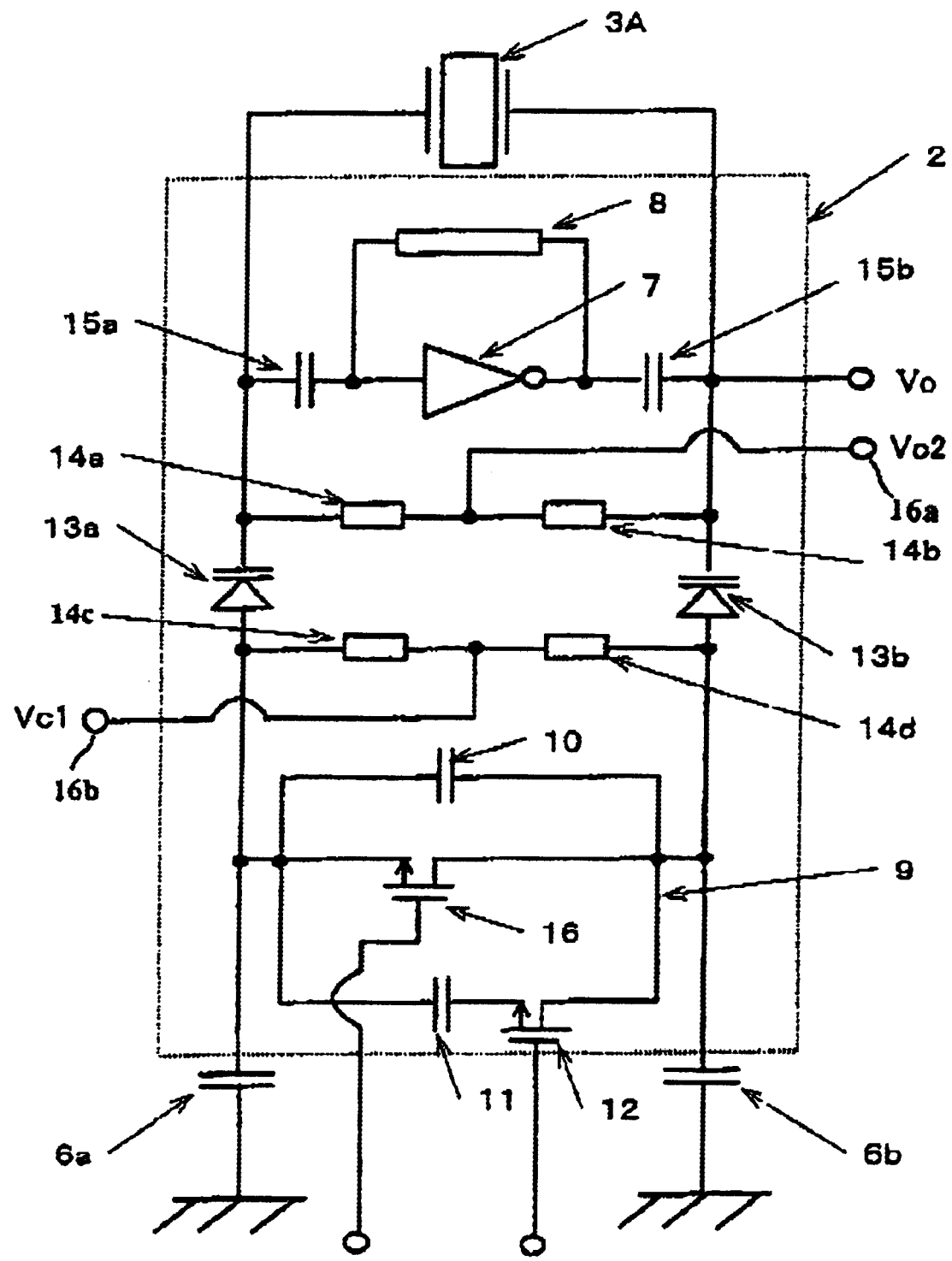
FIG. 7 is a circuit diagram of a voltage-controlled surface-mount crystal oscillator according to a third embodiment of the present invention.

The surface-mount crystal oscillator according to the third embodiment is shown in FIG. 7. The surface-mount crystal oscillator according to the third embodiment differs from the surface-mount crystal oscillator according to the first embodiment in that voltage-variable capacitive elements 13a, 13b are inserted between oscillating capacitors 6a, 6b and crystal unit 3A with adjustable capacitive assembly 9 having a first and second ends and including switching element 16 for short-circuiting the first and second ends of adjustable capacitive assembly 9. The first end is connected to a node at which oscillating capacitor 6a and voltage-variable capacitive element 13 a connect to each other, and the second end is connected to another node at which oscillating capacitor 6b and voltage-variable capacitive element 13b connect to each other. Switching element 16 typically comprises a MOSFET. In the surface-mount crystal oscillator according to the third embodiment, therefore, voltage-variable capacitive elements 13a, 13b are inserted between the parallel-connected circuit of oscillating capacitors 6a, 6b and adjustable capacitive assembly 9, and the connecting terminals of crystal unit 3A. A temperature compensating voltage as a control voltage VC1 is applied through terminal 16b and resistors 14c, 14d which serve to cut off high frequency components to the anodes of voltage-variable capacitive elements 13a, 13b, and a frequency control voltage Vc2 from an automatic frequency control (AFC) circuit, for example, is applied through terminal 16a and resistors 14a, 14b which serve to cut off high frequency components to the cathodes of voltage-variable capacitive elements 13a, 13b. As with the second embodiment, DC-blocking capacitors 15a, 15b are connected to the input and output terminals of inverting amplifier 7 for preventing the control voltage from being applied to inverting amplifier 7.

Figure 8:
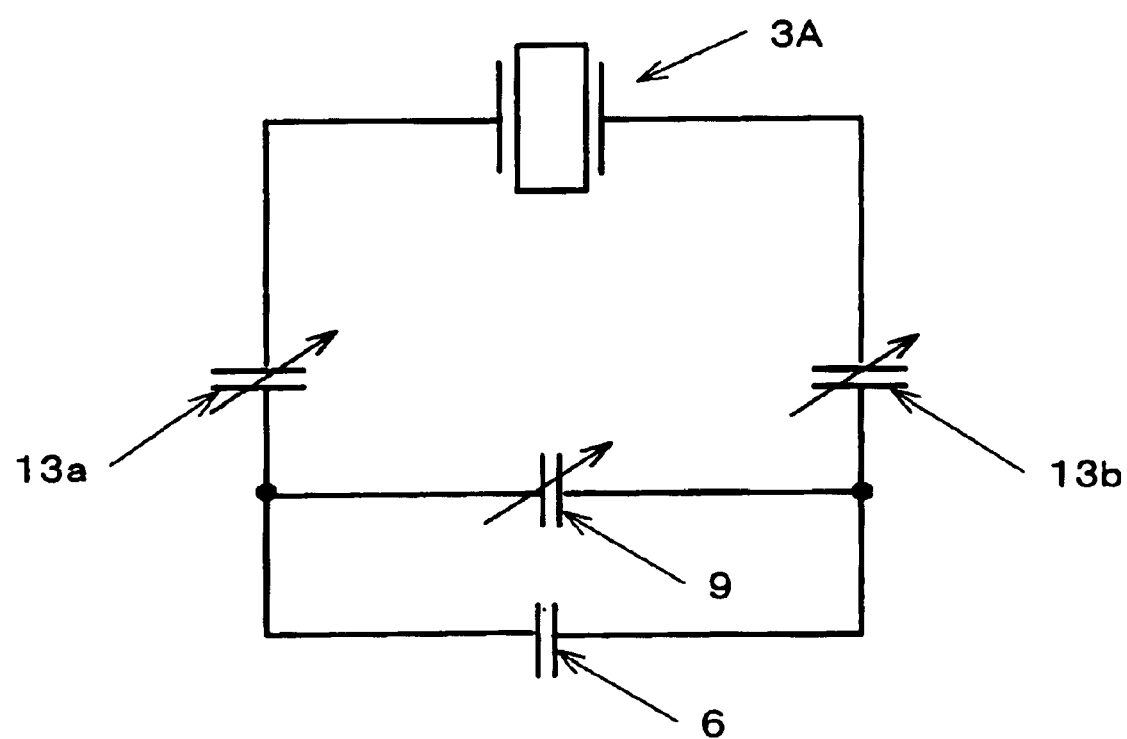
FIG. 8 is an equivalent circuit diagram showing capacitive components of the voltage-controlled surface-mount crystal oscillator shown in FIG. 7.

With the crystal oscillator shown in FIG. 7, the capacitive component as viewed from crystal unit 3A is represented by a circuit which comprises a parallel-connected circuit of adjustable capacitive assembly 9 and combined capacitor 6 composed of oscillating capacitors 6a, 6b, as shown in FIG. 8, and voltage-variable capacitive elements 13a, 13b connected to the junctions between combined capacitor 6 and adjustable capacitive assembly 9. Since the capacitance of voltage-variable capacitive elements 13a, 13b is smaller than the sum of the capacitance of combined capacitor 6 and the capacitance of adjustable capacitive assembly 9, a change in the capacitance of voltage-variable capacitive elements 13a, 13b becomes dominant, and the rate of change of the capacitance does not change substantially even when adjustable capacitive assembly 9 is adjusted.

When switching element 16 of adjustable capacitive assembly 9 is turned on, the parallel-connected circuit of adjustable capacitive assembly 9 is short-circuited, making oscillating capacitors 6a, 6b non-functional, but voltage-variable capacitors 13a, 13b function as oscillating capacitive elements. The rate of change of the capacitance of voltage-variable capacitive elements 13a, 13b becomes maximum as no other capacitors are connected series or parallel to voltage-variable capacitive elements 13a, 13b, but is not largely different from the rate of change of the capacitance of voltage-variable capacitive elements 13a, 13b at the time switching element 16 is turned off.

In the present invention, the equivalent series capacitance as viewed from crystal unit 3A can be changed by selectively turning on and off switching elements 12, 16 of adjustable capacitive assembly 9. Specifically, when switching element 16 of adjustable capacitive assembly 9 is turned on, short-circuiting the parallel-connected circuit of adjustable capacitive assembly 9, the capacitance of adjustable capacitive assembly 9 becomes maximum (infinite), and hence the equivalent series capacitance as viewed from crystal unit 3A becomes maximum. Therefore, the oscillating frequency is in a low range. When switching element 16 is turned off and switching element 12 is turned on, since the capacitance of adjustable capacitive assembly 9 becomes C10+C11, the equivalent series capacitance is smaller than when switching element 16 is turned on. Therefore, the oscillating frequency is in a middle range. When both switching elements 12, 16 are turned off, making only first capacitor 10 effective, since the capacitance of adjustable capacitive assembly 9 becomes minimum (i.e., C10), the equivalent series capacitance also becomes smallest. Therefore, the oscillating frequency is in a high range. The oscillating frequency can be shifted into one of these ranges by selecting either one of the above three states with switching elements 12, 16.

With the surface-mount crystal oscillator according to the third embodiment, therefore, the variable range of oscillating frequencies can be increased by selecting the substantial capacitance of adjustable capacitive assembly 9. Inasmuch as adjustable capacitive assembly 9 is connected parallel to oscillating capacitors 6a, 6b, overall capacitance that is required can be reduced, allowing the crystal oscillator to be easily incorporated into an integrated circuit.

In the third embodiment, the temperature compensating voltage Vc1 and the frequency control voltage Vc2 are applied as the control voltages respectively to the anodes and cathodes of the voltage-variable capacitive element. However, the temperature compensating voltage Vc1 may be applied to the anodes of the voltage-variable capacitive elements, whereas a fixed voltage may be applied to the cathodes of the voltage-variable capacitive elements. The control voltage Vc applied to the voltage-variable capacitive elements is not limited to the temperature compensating voltage Vc1. The surface-mount crystal oscillator also functions as a crystal oscillator even if voltage-variable capacitive elements 13a, 13b comprise simple fixed-capacitance capacitors.

In the crystal oscillators according to the second and third embodiments, voltage-variable capacitive elements 13a, 13b are connected to the respective ends of crystal unit 13A. However, the crystal oscillators can operate as a voltage-controlled crystal oscillator even if only one of the voltage-variable capacitive elements is employed.

In each of the embodiments, the present invention is applied to a surface-mount crystal oscillator. However, the principles of the present invention are also applicable to a crystal oscillator which is not of the surface-mount type or a crystal oscillation circuit.

While preferred embodiments of the present invention have been described using specific terms, such description is for illustrative purposes only, and it is to be understood that changes and variations may be made without departing from the spirit or scope of the following claims.

What is claimed is:

1. A crystal oscillator comprising:
    a crystal unit;
    a first oscillating capacitor connected between a first end of the crystal unit and a reference potential point;
    a second oscillating capacitor connected between a second end of the crystal unit and the reference potential point; and
    an adjustable capacitive assembly having selectable capacitances which is connected in parallel to a combined capacitor comprising the first and second oscillating capacitors, the adjustable capacitive assembly not being directly connected to the reference potential point,
    wherein the adjustable capacitive assembly comprises:
    a first capacitor; and
    a series-connected circuit connected parallel to the first capacitor, the series-connected circuit comprising a second capacitor and a switching element connected in series to the second capacitor.

2. The crystal oscillator according to claim 1, wherein the switching element comprises a MOSFET.

3. A crystal oscillator comprising:
    a crystal unit;
    a first oscillating capacitor connected between a first end of the crystal unit and a reference potential point;
    a second oscillating capacitor connected between a second end of the crystal unit and the reference potential point;
    an adjustable capacitive assembly having selectable capacitances which is connected in parallel to a combined capacitor comprising the first and second oscillating capacitors, the adjustable capacitive assembly not being directly connected to the reference potential point; and
    a voltage-variable capacitive element inserted in at least one of circuits between the first oscillating capacitor and the first end and between the second oscillating capacitor and the second end.

4. The crystal oscillator according to claim 3, wherein the adjustable capacitive assembly comprises:
   a first capacitor;
   a series-connected circuit connected parallel to the first capacitor;
   a first switching element short-circuiting opposite ends of the adjustable capacitive assembly; and
   the series-connected circuit comprising a second capacitor and a second switching element connected in series to the second capacitor.

5. The crystal oscillator according to claim 4, wherein each of the first and second switching elements comprises a MOSFET.

6. The crystal oscillator according to claim 3, further comprising:
   means for applying a first control voltage to an anode of the voltage-variable capacitive element; and
   means for applying a second control voltage to a cathode of the voltage-variable capacitive element.

7. The crystal oscillator according to claim 3, further comprising an amplifier for maintaining oscillation in a resonance loop comprising the crystal unit, the first and second oscillating capacitors, and the voltage-variable capacitive element.

* * * * *